(12) United States Patent
Akutsu et al.

(10) Patent No.: US 10,943,879 B2
(45) Date of Patent: Mar. 9, 2021

(54) BUMP-FORMING FILM, SEMICONDUCTOR DEVICE AND MANUFACTURING METHOD THEREOF, AND CONNECTION STRUCTURE

(71) Applicant: DEXERIALS CORPORATION, Tokyo (JP)

(72) Inventors: Yasushi Akutsu, Utsunomiya (JP); Tomoyuki Ishimatsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/542,343

(22) PCT Filed: Jan. 13, 2016

(86) PCT No.: PCT/JP2016/050805
§ 371 (c)(1),
(2) Date: Jul. 7, 2017

(87) PCT Pub. No.: WO2016/114293
PCT Pub. Date: Jul. 21, 2016

(65) Prior Publication Data
US 2018/0218990 A1    Aug. 2, 2018

(30) Foreign Application Priority Data

Jan. 13, 2015    (JP) .............................. JP2015-004591

(51) Int. Cl.
*H01L 23/00*    (2006.01)

(52) U.S. Cl.
CPC .............. *H01L 24/11* (2013.01); *H01L 24/03* (2013.01); *H01L 24/13* (2013.01); *H01L 24/27* (2013.01);
(Continued)

(58) Field of Classification Search
CPC ..................... H01L 24/29; H01L 24/83; H01L 2224/10152; H01L 2224/1012;
(Continued)

(56) References Cited

U.S. PATENT DOCUMENTS

2004/0070084 A1    4/2004    Kuramoto et al.
2005/0276934 A1*   12/2005   Fukui .................. C08G 65/329
                                                        428/32.6
(Continued)

FOREIGN PATENT DOCUMENTS

CN    102668251 A    9/2012
CN    104541417 A    4/2015
(Continued)

OTHER PUBLICATIONS

Apr. 5, 2016 International Search Report issued in International Patent Application No. PCT/JP2016/050805.
(Continued)

*Primary Examiner* — Alia Sabur
(74) *Attorney, Agent, or Firm* — Oliff PLC

(57) ABSTRACT

A bump-forming film is used for forming, on a semiconductor device such as a bumpless IC chip, bumps which are low in cost and can achieve stable conduction reliability. The bump-forming film is configured such that conductive fillers for bumps are arranged regularly in a planar view in an insulating adhesive resin layer. The regular arrangement has a periodic repeating unit in the longitudinal direction of the film. The straight line which connects one ends of the conductive fillers for bumps in the thickness direction of the film is substantially parallel to the surface of the film.

18 Claims, 6 Drawing Sheets

(52) U.S. Cl.
CPC .............. *H01L 24/29* (2013.01); *H01L 24/73* (2013.01); *H01L 24/81* (2013.01); *H01L 24/83* (2013.01); *H01L 24/92* (2013.01); *H01L 24/05* (2013.01); *H01L 24/16* (2013.01); *H01L 24/32* (2013.01); *H01L 2224/0401* (2013.01); *H01L 2224/06102* (2013.01); *H01L 2224/10152* (2013.01); *H01L 2224/111* (2013.01); *H01L 2224/11003* (2013.01); *H01L 2224/11436* (2013.01); *H01L 2224/131* (2013.01); *H01L 2224/136* (2013.01); *H01L 2224/13014* (2013.01); *H01L 2224/13015* (2013.01); *H01L 2224/13018* (2013.01); *H01L 2224/13019* (2013.01); *H01L 2224/1319* (2013.01); *H01L 2224/1336* (2013.01); *H01L 2224/1357* (2013.01); *H01L 2224/13582* (2013.01); *H01L 2224/13644* (2013.01); *H01L 2224/13655* (2013.01); *H01L 2224/16227* (2013.01); *H01L 2224/27003* (2013.01); *H01L 2224/27334* (2013.01); *H01L 2224/27436* (2013.01); *H01L 2224/27515* (2013.01); *H01L 2224/293* (2013.01); *H01L 2224/294* (2013.01); *H01L 2224/2919* (2013.01); *H01L 2224/2929* (2013.01); *H01L 2224/2939* (2013.01); *H01L 2224/29082* (2013.01); *H01L 2224/29444* (2013.01); *H01L 2224/29455* (2013.01); *H01L 2224/29499* (2013.01); *H01L 2224/32225* (2013.01); *H01L 2224/73104* (2013.01); *H01L 2224/81101* (2013.01); *H01L 2224/81191* (2013.01); *H01L 2224/83192* (2013.01); *H01L 2224/83862* (2013.01); *H01L 2224/83874* (2013.01); *H01L 2224/9211* (2013.01)

(58) Field of Classification Search
CPC ... H01L 2224/11005; H01L 2224/1134; H05K 3/3478
See application file for complete search history.

(56) References Cited

U.S. PATENT DOCUMENTS

| | | | | |
|---|---|---|---|---|
| 2008/0176393 | A1* | 7/2008 | Mackay | H01L 21/44 438/613 |
| 2009/0090545 | A1* | 4/2009 | Usui | H01L 24/27 174/260 |

FOREIGN PATENT DOCUMENTS

| | | | |
|---|---|---|---|
| JP | S62-229714 | A | 10/1987 |
| JP | H0574512 | A | 3/1993 |
| JP | H07-302666 | A | 11/1995 |
| JP | H09-312176 | A | 12/1997 |
| JP | H09320345 | A | 12/1997 |
| JP | H10-135224 | A | 5/1998 |
| JP | H11-330160 | A | 11/1999 |
| JP | 3362370 | B2 * | 1/2003 |
| JP | 2003208931 | A | 7/2003 |
| JP | 2003220669 | A * | 8/2003 |
| JP | 2004-080024 | A | 3/2004 |
| JP | 2004080024 | A * | 3/2004 |
| JP | 2005-286349 | A | 10/2005 |
| JP | 2008-31483 | A | 2/2008 |
| JP | 2012-190871 | A | 10/2012 |
| KR | 2007-0104742 | A | 10/2007 |
| KR | 10-2008-0111500 | A | 12/2008 |
| KR | 2009-0073218 | A | 7/2009 |
| WO | 2014/030744 | A1 | 2/2014 |

OTHER PUBLICATIONS

Apr. 5, 2016 Written Opinion issued in International Patent Application No. PCT/JP2016/050805.
Jan. 18, 2017 International Preliminary Report on Patentability issued in International Patent Application No. PCT/JP2016/050805.
Jul. 19, 2018 Office Action in Korean Application No. 10-2017-7017937.
Dec. 6, 2018 Office Action issued in Korean Application No. 10-2017-7017937.
Dec. 25, 2018 Office Action issued in Chinese Application No. 201680004710.9.
Feb. 7, 2019 Office Action issued in Korean Patent Application No. 10-2017-7017937.
Jul. 18, 2019 Office Action issued in Korean Patent Application No. 10-2017-7017937.
Jan. 16, 2020 Office Action issued in Taiwanese Patent Application No. 105101040.
Jan. 7, 2020 Office Action issued in Japanese Patent Application No. 2016-004215.
Jun. 8, 2020 Office Action issued in Chinese Patent Application No. 201680004710.9.
Sep. 11, 2020 Office Action issued in Taiwanese Patent Application No. 105101040.
Oct. 14, 2019 Office Action issued in Chinese Patent Application No. 201680004710.9.

* cited by examiner

BUMP-FORMING FILM, SEMICONDUCTOR DEVICE AND MANUFACTURING METHOD THEREOF, AND CONNECTION STRUCTURE

TECHNICAL FIELD

The present invention relates to a bump-forming film for forming bumps on electrode pads of an IC chip or the like.

BACKGROUND ART

In order to achieve low conduction resistance and stable conduction reliability when a bumpless IC chip is flip-chip mounted on a circuit board, it has been proposed that gold bumps are previously provided by a stud bump method on electrode pads of the bumpless IC chip which is not coated with a passivation film, or that metal-plated resin particles which are expected to act as bumps are metal-bonded to the electrode pads by ultrasonic heating (Patent Literature 1).

CITATION LIST

Patent Literature

Patent Literature 1: Japanese Patent Application Laid-Open No. 2005-286349

SUMMARY OF INVENTION

Technical Problem

However, the provision of the gold bumps by a stud bump method on the electrode pads of a bumpless IC chip causes a manufacturing cost of an IC chip to significantly increase. Therefore, there is a problem that it is commercially difficult to adopt. Also, when the surface metal of the metal-coated resin particles is metal-connected by ultrasonic heating to the electrode pads of a bumpless IC chip, there has been concern that the surface metal could be peeled thereby significantly reducing conduction reliability. Furthermore, there has been a problem that the manufacturing process becomes complicated.

An object of the present invention is to solve the above-described problems of known technologies, and to allow bumps which are low in cost and can achieve stable conduction reliability to be formed on a semiconductor device such as a bumpless IC chip.

Solution to Problem

On the basis of the assumption that the above-described problems can be solved if conductive fillers which can be expected to act as bumps of a semiconductor device can be supplied on electrodes of the semiconductor device with a bump-forming film in a simple manner, the present inventors have found that the object of the present invention can be achieved when conductive fillers for bumps are arranged regularly in the longitudinal direction of the film in a planar view within an insulating adhesive resin layer with a periodical repeating unit, and the straight line which connects one ends of the conductive fillers for bumps in the film thickness direction is substantially parallel to the surface of the film. Thus, the present invention has been accomplished.

That is, the present invention provides a "bump-forming film including conductive fillers for bumps which are arranged regularly in a planar view in an insulating adhesive resin layer, in which the regular arrangement has a periodic repeating unit in a longitudinal direction of the film, and a straight line which connects one ends of the conductive fillers for bumps in a thickness direction of the film is substantially parallel to a surface of the film."

Also, the present invention provides a manufacturing method of the bump-forming film according to the above-described present invention, including the following steps (a) to (c):
<Step (a)>
preparing a transfer body which contains regularly arranged concave portions formed on its surface;
<Step (b)>
filling the concave portions of the transfer body with conductive fillers for bumps; and
<Step (c)>
superimposing and pressing an insulating adhesive resin layer on the transfer body at the surface having been filled with the conductive fillers for bumps, so that the conductive fillers for bumps are transferred to the insulating adhesive resin layer.

This manufacturing method preferably further includes the following step (d)
<Step (d)>
laminating an insulating adhesive cover layer on the insulating adhesive resin layer to which the conductive fillers for bumps have been transferred, from the surface side where the conductive fillers for bumps have been transferred.

Also, the present invention provides an "electronic component having on a surface thereof a base electrode for a bump on which a bump is disposed, in which the above-described bump-forming film is disposed on the electronic component at the surface having the base electrode such that a conductive filler for bumps of the bump-forming film becomes a bump of the base electrode." Specifically, the present invention provides a "semiconductor device having on a surface thereof a base electrode for a bump on which a bump is disposed, in which the above-described bump-forming film is disposed on the semiconductor device at the surface having the base electrode such that the conductive filler for bumps of the bump-forming film becomes a bump of the base electrode."

Furthermore, the present invention provides a "manufacturing method of an electronic component having on a surface thereof a base electrode for a bump on which a bump is disposed, including:
disposing the bump-forming film according to the present invention on a bumpless electronic component having on the surface the base electrode for a bump at the surface having the base electrode such that the conductive filler for bumps of the bump-forming film faces the base electrode of the electronic component; and thereafter fixing the conductive filler for bumps to the base electrode with an insulating adhesive resin which constitutes the bump-forming film." Specifically, the present invention provides a "manufacturing method of a semiconductor device having on a surface thereof a base electrode for a bump on which a bump is disposed, including:
disposing the bump-forming film according to the present invention on a bumpless semiconductor device having on the surface the base electrode for a bump at the surface having the base electrode such that the conductive filler for bumps of the bump-forming film faces the base electrode of the semiconductor device; and thereafter fixing the conductive filler for bumps to the base electrode by curing an insulating adhesive resin layer which constitutes the bump-forming film."

Similarly, the present invention provides a "manufacturing method of a semiconductor device having on a surface thereof a base electrode for a bump on which a bump is disposed, including:

disposing the bump-forming film according to the present invention on a bumpless semiconductor device having on the surface the base electrode for a bump at the surface having the base electrode such that the conductive filler for bumps of the bump-forming film faces the base electrode of the semiconductor device; and thereafter heating the conductive filler for bumps so as to be metal-bonded and fixed to the base electrode."

In addition, the present invention provides a "connection structure in which the conductive filler for bumps disposed on the base electrode on the surface of the above-described electronic component is connected to a corresponding terminal of another electronic component through a curable or non-curable, conductive or insulating adhesive or by forming a metal bond between them." Specifically, the present invention provides a "connection structure in which the conductive filler for bumps disposed on the base electrode on the surface of the above-described semiconductor device is connected to a corresponding terminal of another electronic component through a curable or non-curable, conductive or insulating adhesive or by forming a metal bond between them."

Advantageous Effects of Invention

The bump-forming film according to the present invention includes the conductive fillers for bumps which are arranged regularly in a planar view within the insulating adhesive resin layer so as to have a periodic repeating unit in the longitudinal direction of the film. This allows the conductive fillers for bumps to be disposed on individual electrodes of a semiconductor device such as an IC chip. Furthermore, in the bump-forming film according to the present invention, the straight line which connects one ends of the conductive fillers for bumps in the thickness direction of the film is substantially parallel to the surface of the film. Therefore, even when electrodes of a semiconductor device on which bumps are to be formed are somewhat uneven in height, the conductive fillers for bumps can be stably disposed on the electrodes.

DESCRIPTION OF EMBODIMENTS

Hereinafter, the present invention will be described with reference to the drawings.

<Bump-Forming Film>

Figure 1:
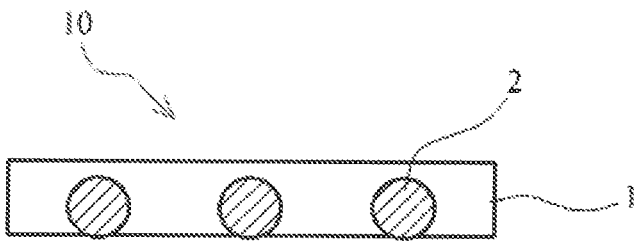
FIG. 1 is a cross-sectional view of a bump-forming film according to the present invention.

As illustrated in FIG. 1, a bump-forming film 10 according to the present invention is a bump-forming film including conductive fillers for bumps 2 which are arranged regularly in a planar view within an insulating adhesive resin layer 1. The regular arrangement of the conductive fillers for bumps 2 has a periodic repeating unit in the longitudinal direction of the film. This periodic repeating unit can be appropriately selected corresponding to an electrode pattern of a semiconductor device on which bumps are to be formed. Also, the number of conductive fillers for bumps 2 to be disposed for one electrode of a semiconductor device on which bumps are to be formed may be one, or may be two or more. It is noted that the conductive fillers for bumps 2 may be disposed in proximity with each other, or may be linked to each other, within the range that does not impair the effects of the invention. When the conductive fillers for bumps 2 are disposed in proximity with each other or linked to each other, the influence of a positional gap can be reduced, and an alignment operation becomes easy.

In the bump-forming film 10 according to the present invention, the straight line which connects one ends of the conductive fillers for bumps 2 in the thickness direction of the film is substantially parallel to the surface of the film. FIG. 1 is an example in which the lines on the front and back surface sides of the film are parallel to the front and back surface sides of the bump-forming film 10, respectively. This allows the conductive fillers for bumps to be reliably stably disposed on electrodes of a semiconductor device on which bumps are to be formed. It is noted that the degree of substantial parallelism is that the angle formed between the straight line which connects one ends of the conductive fillers for bumps 2 in the thickness direction of the film and the surface of the film is within ±5°.

Examples of the conductive fillers for bumps 2 may include solder particles, nickel particles, and metal-coated resin particles. Among these, preferable examples may include solder particles and solder plated resin particles, which can form a metal bond with a terminal material such as copper at a relatively low temperature. In particular, solder particles are preferable. Also, from the viewpoint of easily obtaining conduction reliability of the connection between the electrodes for bumps and the corresponding terminals of another electronic component, metal-coated resin particles can be preferably used. Here, the metal coat of the metal-coated resin particles can be formed by a known metal film formation method such as electroless plating and sputtering. Also, conductive fine particles can be contained in core resin particles which constitute the metal-coated resin particles, in order to improve conduction reliability.

The average particle diameter of the conductive fillers for bumps 2 measured using an image-type particle size distribution measuring device is preferably 3 to 60 µm, and more preferably 8 to 50 µm. When the average particle diameter is within this range, the conductive fillers for bumps 2 can be easily matched with the terminal size of a general semiconductor device. Also, the sizes (average particle diameters) of the conductive fillers for bumps 2 are preferably substantially the same so that the terminals are equally pressed. Here, being "substantially the same" means that a CV value as the ratio of the standard deviation of a particle diameter relative to the average particle diameter is 20% or less, and preferably 10% or less.

It is noted that the shape of the conductive fillers for bumps 2 is preferably a true spherical shape, but may be a substantially spherical shape, an oval spherical shape and the like, which are similar to the true spherical shape. Also, fine bumps and dents may exist on the surface. With the fine bumps and dents, the effect of increasing a surface area and the anchor effect during pressing can be expected to be obtained. Accordingly, lowered resistance and stabilization during conduction can be expected to be achieved.

On the other hand, the thickness of the insulating adhesive resin layer 1 is preferably 0.5 to 20 times, and more preferably 0.8 to 15 times, the average particle diameter of the conductive fillers for bumps 2. When the thickness is within this range, stable fixation to the bump positions can be achieved. Also, it is preferable that the thickness of the insulating adhesive resin layer 1 be such that parts of the conductive fillers for bumps 2 are exposed from the insulating adhesive resin layer 1 within this range. This enhances operability for, for example, removing the insulating adhesive resin layer 1 and laminating with another insulating adhesive resin layer as described later.

Such an insulating adhesive resin layer 1 preferably has adhesiveness in order to fix the conductive fillers for bumps 2 to electrodes of a semiconductor device, and may be photocurable or thermosetting in order to enhance adhesion. If the insulating adhesive resin layer 1 is cured to form a metal bond between the conductive fillers for bumps 2 and the electrodes of the semiconductor device, the insulating adhesive resin layer 1 can be removed while leaving the metal-bonded conductive fillers for bumps 2.

Also, when the conductive fillers for bumps 2 are fixed with the insulating adhesive resin layer 1 without a metal bond, another insulating adhesive resin layer may be combined to connect with another electronic component. In this case, another insulating adhesive resin layer may be previously provided to another electronic component, or may be previously laminated on the insulating adhesive resin layer having the conductive fillers for bumps 2. In this case, when the conductive fillers for bumps 2 are metal-plated resin particles, the particle diameter thereof may be larger than the overall thickness of the insulating adhesive resin layers. This allows conduction connection to be easily retained due to the repulsion of resin particles, after the conductive fillers for bumps 2 have been deformed (flattened) following the connection. When the conductive fillers for bumps 2 have material properties of being easily flattened, it is preferable that the conductive fillers for bumps 2 be slightly spaced apart from each other so that flattening is not inhibited. This is because there is concern that flattening could cause misalignment of the conductive fillers for bumps 2. As an example, the conductive fillers for bumps 2 are spaced apart from each other by preferably 20% or more, and more preferably 30% or more, of the size (average particle diameter) of the conductive fillers for bumps 2. On the other hand, since there is concern that capture efficiency could decrease when the conductive fillers for bumps 2 are spaced apart from each other by 50% or more, less than 50% is preferable. When the conductive fillers for bumps 2 are defined as described above, the conductive fillers for bumps can densely exist in a needed site. This is preferable in terms of maintaining quality during manufacture (also preferable in terms of stabilizing conduction resistance values).

When the conductive fillers for bumps 2 are spaced apart from each other to such a level, the plurality of conductive fillers for bumps 2 may constitute a unit. This is preferable because conduction resistance values can be stabilized by constituting a unit.

Also, the outer shape of such a unit is preferably rectangular or circular. This is because the bump shape itself generally has such a shape.

When the unit is rectangular, the size (average particle diameter) of the conductive fillers for bumps 2 is equivalent to the height required for the bumps, depending on the height and width (that is, the aspect ratio) required for the bumps. In the width direction, a row of the conductive fillers for bumps 2 may be formed to constitute a unit. In this case, it is also preferable that the above-described distance interval be maintained. Also, the row may be deviated from conductive fillers for bumps 2 may be deviated by up to a half of the average particle diameter of the fillers.

Also, when the unit is circular, the shape may be such that, of the conductive fillers for bumps 2, one is placed at the center, and the others are disposed around the center along a circular shape. In this case, it is also preferable that the above-described distance interval be maintained. This shape may be such that conductive particles are disposed at respective corners and a center of a regular polygon such as a regular triangle and a square. It is noted that the shape of this regular polygon may be distorted. This is because, for example, when a plurality of sites on which bumps are to be formed exist on the same plane, uniform pressing by a tool can be achieved.

For obtaining the insulating adhesive resin layer 1 having photocurable or thermosetting properties, a photopolymerization or thermal polymerization initiator, in addition to a known photocurable or thermosetting oligomer or monomer, may be formulated in a resin composition which constitutes the insulating adhesive resin layer 1. Examples of such an insulating adhesive resin layer to be adopted may include a thermoplastic acryl-based or epoxy-based resin film, and a thermosetting or photocurable acryl-based or epoxy-based resin film. The thickness of such an insulating adhesive resin layer 1 is usually 10 to 40 µm.

<Manufacturing Method of Bump-Forming Film>

The bump-forming film according to the present invention can be manufactured by a manufacturing method which includes the following steps (a) to (c), and preferably (d). With reference to the drawings, each step will be described in detail.

(Step (a))

Figure 2:
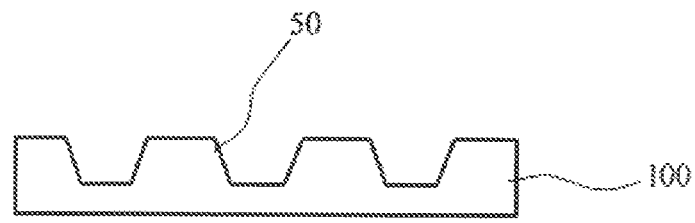
FIG. 2 is a diagram illustrating a process of a manufacturing method of the bump-forming film according to the present invention.

First, as illustrated in FIG. 2, there is prepared a transfer body 100 which includes on its surface regularly arranged concave portions 50 (for example, columnar concave portions which are equivalent to lattice points of a planar lattice pattern). The depth of the concave portions 50 can be determined according to the electrode pitch, electrode width, and inter-electrode space width of electrodes (electrode pads, through holes, via holes, and the like) of a semiconductor device such as IC chip on which bumps are to be formed, the average particle diameter of the conductive fillers for bumps, and the like.

*Specific Examples of Transfer Body

The transfer body to be prepared in this step (a) can be produced by a known method, for example, by processing a metal plate to obtain a master, coating the master with a curable resin, and curing the coat. Specifically, the transfer body can be obtained by cutting a flat metal plate and forming convex portions corresponding to concave portions thereby to produce a transfer body master, coating the master on the surface having the formed convex portions with a resin composition to constitute a transfer body, curing the coat, and thereafter removing the cured coat from the master.

(Step (b))

Figure 3:
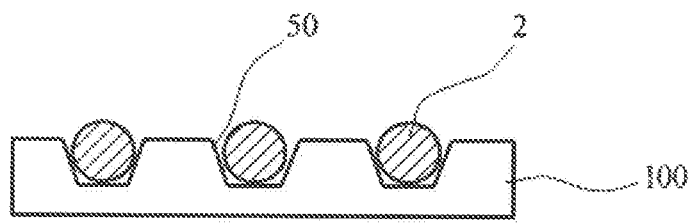
FIG. 3 is a diagram illustrating a process of the manufacturing method of the bump-forming film according to the present invention.

Next, as illustrated in FIG. 3, the concave portions 50 of the transfer body 100 are filled with the conductive fillers for bumps 2. Specifically, the conductive fillers for bumps 2 may be dispersed downward on the concave portions 50 of the transfer body 100. Then, the fillers with which the concave portions have not been filled may be removed using a brush, a blade, or an air blower.

(Step (c))

Figure 4:
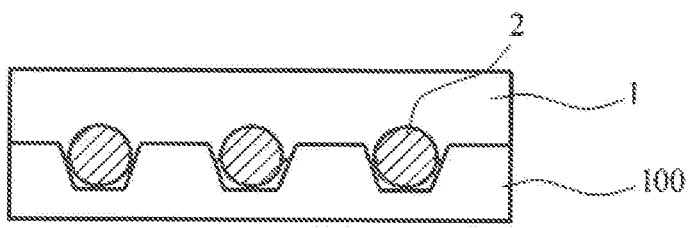
FIG. 4 is a diagram illustrating a process of the manufacturing method of the bump-forming film according to the present invention.

Next, as illustrated in FIG. 4, the insulating adhesive resin layer 1 is superimposed on the transfer body 100 at the surface which has been filled with the conductive fillers for bumps 2, and the laminated product was pressed. Accordingly, the conductive fillers for bumps 2 are transferred to one surface of the insulating adhesive resin layer 1. In this case, the conductive fillers for bumps 2 are allowed to be buried into the insulating adhesive resin layer 1. Thus, the bump-forming film 10 as illustrated in FIG. 1 is obtained.

It is noted that although the bump-forming film according to the present invention can be obtained by the above-described steps (a) to (c), the following step (d) may be further performed.

(Step (d))

Figure 5:
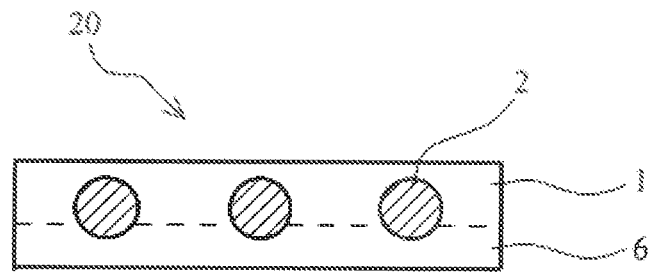
FIG. 5 is a diagram illustrating a process of the manufacturing method of the bump-forming film according to the present invention.

As illustrated in FIG. 5, an insulating adhesive cover layer 6 can be laminated on the insulating adhesive resin layer 1 to which the conductive fillers for bumps 2 have been transferred, from the surface side where the conductive fillers for bumps have been transferred. Accordingly, a bump-forming film 20 having a two-layer structured insulating adhesive resin layer is obtained. The insulating adhesive cover layer 6 may be formed with the same material as that of the insulating adhesive resin layer 1. In general, an adhesive resin film, a thermosetting resin film, and a photocurable resin film can also be used.

(Electronic Component Such as Semiconductor Device)

Figure 6:
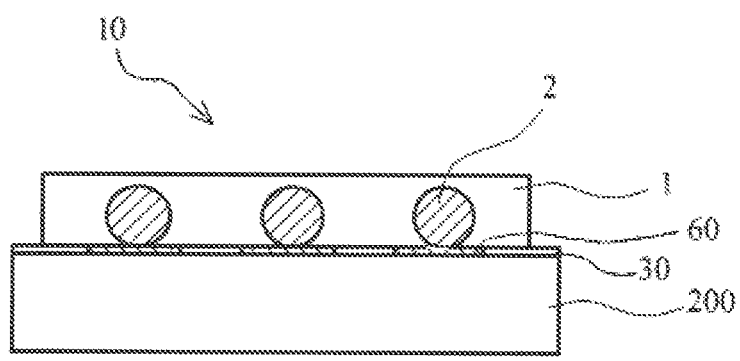
FIG. 6 is a cross-sectional view of a semiconductor device according to the present invention.

The bump-forming film according to the present invention can be applied when bumps are formed on electrodes of an electronic component. That is, the electronic component has a structure in which bumps are disposed on base electrodes for bumps on the surface of the electronic component. The bump-forming film is disposed on the electronic component at the surface having the base electrodes such that the conductive fillers for bumps of the bump-forming film become bumps of the base electrodes. Specifically, the bump-forming film according to the present invention can be preferably applied when bumps are formed on electrodes (pads, through holes, via holes, and the like) of a semiconductor device such as an IC chip and a semiconductor wafer. When the bump-forming film is applied for through holes and via holes, bumps may be inserted in holes. When the bump-forming film is applied for electrode pads, for example, as illustrated in FIG. 6, a semiconductor device 200 has on its surface a structure in which bumps are disposed on base electrodes 60 for bumps each being surrounded by a passivation film 30. In the semiconductor device 200, the bump-forming film 10 according to the present invention is disposed on the semiconductor device 200 at the surface having the base electrodes such that the conductive fillers for bumps 2 of the bump-forming film 10 become bumps of the base electrodes 60. This semiconductor device is also one aspect of the present invention.

In general, the conductive fillers for bumps are fixed to the base electrodes with a curable or non-curable insulating adhesive resin which constitutes the bump-forming film. In the aspect of FIG. 6, it is preferable that the conductive fillers for bumps 2 be fixed to the base electrodes 60 by curing the insulating adhesive resin layer 1 which constitutes the bump-forming film 10.

It is noted that the conductive fillers for bumps 2 may be fixed to the base electrodes 60 by metal-bonding the conductive fillers for bumps 2 to the base electrodes 60 through heating such as resistance heating and ultrasonic heating. In this case, after the formation of a metal bond, the insulating adhesive resin layer 1 which constitutes the bump-forming film 10 may be cured and thereafter peeled.

(Manufacturing Method of Electronic Component Such as Semiconductor Device)

The electronic component having on its surface the base electrodes for bumps on which bumps are disposed can be manufactured by a manufacturing method including: disposing the bump-forming film according to the present invention on a bumpless electronic component having on its surface base electrodes for bumps at the surface having the base electrodes such that the conductive fillers for bumps of the bump-forming film faces the base electrodes of the electronic component; and thereafter fixing the conductive fillers for bumps to the base electrodes with an insulating adhesive resin which constitutes the bump-forming film. Specifically, the semiconductor device according to the present invention which has on its surface base electrodes for bumps on which bumps are disposed can be manufactured by a manufacturing method including: disposing the bump-forming film according to the present invention on a bumpless semiconductor device having on its surface base electrodes for bumps at the surface having the base electrodes such that the conductive fillers for bumps of the bump-forming film faces the base electrodes of the semiconductor device; and thereafter curing an insulating adhesive resin layer which constitutes the bump-forming film by heating or photo-irradiation thereby to fix the conductive fillers for bumps to the base electrodes.

Also, the semiconductor device according to the present invention which has on its surface base electrodes for bumps on which bumps are disposed can be manufactured by a manufacturing method including: disposing the bump-forming film according to the present invention on a bumpless semiconductor device having on its surface base electrodes for bumps at the surface having the base electrodes such that the conductive fillers for bumps of the bump-forming film faces the base electrodes of the semiconductor device; and thereafter heating the conductive fillers for bumps so as to be metal-bonded and fixed to the base electrodes. Each of these manufacturing methods is also one aspect of the present invention.

(Connection Structure)

The connection structure can be obtained by connecting the conductive fillers for bumps disposed on the base electrodes on the surface of the electronic component according to the present invention with corresponding terminals of another electronic component, through a curable or non-curable, conductive or insulating adhesive, or through the formation of a metal bond between them. Specifically, the connection structure can be obtained by connecting the conductive fillers for bumps disposed on the base electrodes on the surface of the semiconductor device according to the present invention with corresponding terminals of another electronic component, through a curable or non-curable, conductive or insulating adhesive, or through the formation of a metal bond between them. Each of these connection structures is also one aspect of the present invention.

EXAMPLES

Hereinafter, the present invention will be specifically described by way of examples.

Example 1

A nickel plate with a thickness of 2 mm was prepared. On the plate, cylindrical convex portions (outer diameter: 35 µm, height: 30 µm) were formed. Thus, a transfer body master was obtained. The arrangement of the convex portions was a 280-location peripheral arrangement in which the convex portions are arranged 200 µm inside a 7-mm square. Also, the density of the convex portions was 5.7 portions/mm$^2$.

The obtained transfer body master was coated with a photopolymerizable resin composition which contains 60 parts by mass of a phenoxy resin (YP-50, Nippon Steel & Sumikin Chemical Co., Ltd.), 29 parts by mass of an acrylate resin (M208, Toagosei Co., Ltd.), and 2 parts by mass of a photopolymerization initiator (IRGACURE 184, BASF Japan Ltd.) such that the dried thickness becomes 30 µm. Then, the coat was dried at 80° C. for five minutes, and thereafter photo-irradiated at 1000 mJ by a high pressure mercury lamp. Thus, a transfer body was produced.

On the surface of the transfer body having been peeled from the transfer body master, solder particles with an average particle diameter of 30 µm (solder fine powder, Mitsui Mining & Smelting Co., Ltd.) as the conductive fillers for bumps were dispersed. Then, air blowing was performed to fill concave portions with the solder particles.

An insulating adhesive resin film with a thickness of 20 µm formed on a PET film was placed on the transfer body at the surface into which the solder particles had been filled, and pressed at a temperature of 50° C. and a pressure of 0.5 MPa. Accordingly, the solder particles were embedded and transferred into the insulating adhesive resin film. The arrangement pattern of the conductive particles was a 1:1 arrangement (an aspect in which one conductive particle is disposed on one electrode pad). Thus, a bump-forming film with an overall thickness of 30 µm was obtained. It is noted that in this bump-forming film, one ends of the conductive particles substantially coincided with the film interface.

It is noted that the insulating adhesive resin film used in Example 1 is a film obtained by: preparing a mixed solution which contains 60 parts by mass of a phenoxy resin (YP-50, Nippon Steel & Sumikin Chemical Co., Ltd.), 40 parts by mass of an epoxy resin (jER828, Mitsubishi Chemical Corporation), and 2 parts by mass of a cationic curing agent (SI-60L, Sanshin Chemical Industry Co., Ltd.); coating with the obtained mixed solution a PET film having a film thickness of 50 µm; and drying the coat in an oven at 80° C. for five minutes.

Example 2

A transfer body was prepared by repeating the same operation as that in Example 1, except that the outside diameter and height of the convex portions of the transfer body master were changed to 25 µm and 20 µm, respectively. Onto this transfer body, solder particles with an average particle diameter of 20 µm (solder fine powder, Mitsui Mining & Smelting Co., Ltd.) were dispersed. Thereafter, air blowing was performed to fill the concave portions with the solder particles.

Insulating adhesive resin films were placed on both surfaces of the transfer body having been filled with solder particles in the same manner as that in Example 1, thereby to obtain a bump-forming film with an overall thickness of 30 µm. It is noted that in this bump-forming film, one ends of the conductive particles substantially coincided with the film interface, similarly to Example 1.

Example 3

Figure 7:
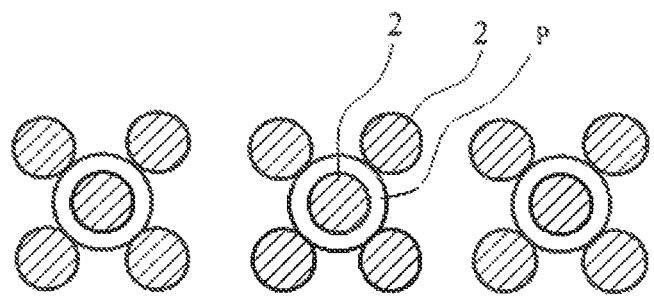
FIG. 7 is a diagram illustrating a relationship between conductive particles and electrode pads in the bump-forming film according to Example 3 in which the conductive particles are arranged at 1:5.

A bump-forming film was obtained by repeating the same operation as that in Example 2, except that the average density of the convex portions of the transfer body master was 28.5 portions/mm$^2$, and the arrangement pattern of the conductive particles was a 1:5 arrangement as illustrated in FIG. 7. In this Example, when the bump-forming film is viewed in a planar view, five conductive particles 2 as a 1:5 arrangement were disposed on, and in proximity with, an electrode pad P to which a particle is to be transferred.

Comparative Example 1

A bump-forming film was obtained by repeating the same operation as that in Example 1, except that a transfer body master in which convex portions are randomly arranged (density of convex portions: 60 portions/mm$^2$) was used.

Examples 4 to 6 and Comparative Example 2

Bump-forming films each having an overall thickness of 30 µm were obtained by repeating the same operations as those in Examples 1 to 3 and Comparative Example 1, except that the solder particles were embedded and transferred into the insulating adhesive resin film by placing, as the insulating adhesive resin film to be applied on the transfer body at the surface having been filled with the solder particles, an insulating adhesive resin film with a thicknesses of 30 µm formed on a PET film, and then pressing the insulating adhesive resin film at a temperature of 50° C. and a pressure of 0.5 MPa. It is noted that in these bump-forming films, one ends of the conductive particles substantially coincided with the film interface, similarly to Example 1.

It is noted that the insulating adhesive resin film used in Examples 4 to 6 and Comparative Example 2 was a film obtained by: preparing a mixed solution which contains 30 parts by mass of a phenoxy resin (YP-50, Nippon Steel & Sumikin Chemical Co., Ltd.), 60 parts by mass of an acryl monomer (LIGHT ACRYLATE 3EGA, Kyoeisha Chemical Co., Ltd.), and 3 parts by mass of a photoradical polymerization initiator (IRGACURE 184, BASF Japan Ltd.); coating with the obtained mixed solution a PET film having a film thickness of 50 µm; and drying the coat in an oven at 80° C. for five minutes.

Examples 7 to 9 and Comparative Example 3

Bump-forming films each having an overall thickness of 30 µm were obtained by repeating the same operations as those in Examples 1 to 3 and Comparative Example 1, except that the solder particles were embedded and transferred into the insulating adhesive resin film by: placing, as the insulating adhesive resin film to be applied on the transfer body at the surface having been filled with the solder particles, an insulating adhesive resin film with a thicknesses of 30 µm formed on a PET film; and then pressing the insulating adhesive resin film at a temperature of 50° C. and a pressure of 0.5 MPa. It is noted that in these bump-forming films, one ends of the conductive particles substantially coincided with the film interface, similarly to Example 1.

It is noted that the insulating adhesive resin film used in Examples 7 to 9 and Comparative Example 3 was a film obtained by: preparing a mixed solution which contains 30 parts by mass of a phenoxy resin (YP-50, Nippon Steel & Sumikin Chemical Co., Ltd.), 60 parts by mass of an acryl monomer (LIGHT ACRYLATE 3EGA, Kyoeisha Chemical Co., Ltd.), 3 parts by mass of a release agent (BYK3500, BYK Japan KK), and 3 parts by mass of a photoradical polymerization initiator (IRGACURE 184, BASF Japan Ltd.); coating with the obtained mixed solution a PET film having a film thickness of 50 µm; and drying the coat in an oven at 80° C. for five minutes.
(Evaluation)

Connection structures were produced with the bump-forming films according to Examples 1 to 9 and Comparative Examples 1 to 3 as described below. The produced connection structures were measured and evaluated for the conduction resistance value (initial conduction resistance value) during the formation of bumps, and the conduction resistance value (resistance value after a high-temperature and high-humidity bias test) during the application of a voltage at 50 V under an environment of a temperature of 85° C. and a humidity of 85%. The conduction resistance values were measured using a digital multimeter (34401A, Agilent Technologies Inc.) by a four-terminal method in an energization condition of 1 mA.

The initial conduction resistance value was evaluated as good (G) when it was 5Ω or less, and as no good (NG) when it exceeded 5Ω. Also, the resistance value after a high-temperature high-humidity bias test was evaluated as good (G) when it was 20Ω or less, and as no good (NG) when it exceeded 20Ω. The obtained results are shown in Table 1.

(Production of Connection Structures with Bump-Forming Films According to Examples 1 to 3 and Comparative Example 1)

There was prepared a bumpless IC chip (size: 7 mm in length×7 mm in width×200 µm in thickness) including peripherally arranged aluminum electrode pads (diameter: 30 µm, pitch: 85 µm, 280 pins). The bump-forming film was disposed on the electrode pads, and pressed at a temperature of 50° C. and a pressure of 0.5 MPa so as to be pasted and fixed to the electrode pads. In the cases of Examples 1 to 2, one conductive filler for bumps (one solder particle) corresponded to one electrode pad. The IC chip on which this bump-forming film was pasted was connected to a glass epoxy substrate (material properties: FR4) for mounting ICs, under the condition of a temperature of 180° C., a pressure of 40 MPa, and a heating and pressurizing time of 10 seconds. Accordingly, a connection structure was obtained.
(Production of Connection Structures with Bump-Forming Films According to Examples 4 to 6 and Comparative Example 2)

The bump-forming film was pasted on an IC chip in the same manner as that in Example 1, and thereafter irradiated with ultraviolet rays at a wavelength of 365 nm (irradiation intensity: 100 mW, irradiation amount: 2000 mW/cm²) for photoradical polymerization so as to be fixed to the IC chip. In the cases of Examples 3 to 4, one conductive filler for bumps (one solder particle) corresponded to one electrode pad. The IC chip on which this bump-forming film was pasted was connected to a glass epoxy substrate (material properties: FR4) for mounting ICs, through a cationically polymerizable insulating adhesive resin film (a film containing 60 parts by mass of a phenoxy resin (YP-50, Nippon Steel & Sumikin Chemical Co., Ltd.), 40 parts by mass of an epoxy resin (jER828, Mitsubishi Chemical Corporation), and 2 parts by mass of a cationic curing agent (SI-60L, Sanshin Chemical Industry Co., Ltd.)), under the condition of a temperature of 180° C., a pressure of 40 MPa, and a heating and pressurizing time of 20 seconds. Accordingly, a connection structure was obtained.
(Production of Connection Structures with Bump-Forming Films According to Examples 7 to 9 and Comparative Example 3)

The bump-forming film was pasted on an IC chip in the same manner as that in Example 1, and thereafter irradiated with ultraviolet rays at a wavelength of 365 nm (irradiation intensity: 100 mW, irradiation amount: 2000 mW/cm²) for photoradical polymerization so as to be fixed to the IC chip. In the cases of Examples 5 to 6, one conductive filler for bumps (one solder particle) corresponded to one electrode pad. This bump-forming film was peeled from the IC chip. It was observed that the conductive fillers for forming bumps were connected to the electrode pads of the IC chip. Next, the IC chip in this state was connected to a glass epoxy substrate (material properties: FR4) for mounting ICs, under the condition of a temperature of 180° C., a pressure of 40 MPa, and a heating and pressurizing time of 20 seconds. Accordingly, a connection structure was obtained.

TABLE 1

| | Conductive Filler for Bump | | | | | | | | | | | |
|---|---|---|---|---|---|---|---|---|---|---|---|---|
| | Com. Ex. 1 | Ex. 1 | Ex. 2 | Ex. 3 | Com. Ex. 2 | Ex. 4 | Ex. 5 | Ex. 6 | Com. Ex. 3 | Ex. 7 | Ex. 8 | Ex. 9 |
| Average Particle Diameter (µm) | 30 | 30 | 20 | 20 | 30 | 30 | 20 | 20 | 30 | 20 | 20 | 30 |

TABLE 1-continued

| | Conductive Filler for Bump | | | | | | | | | | | |
|---|---|---|---|---|---|---|---|---|---|---|---|---|
| | Com. Ex. 1 | Ex. 1 | Ex. 2 | Ex. 3 | Com. Ex. 2 | Ex. 4 | Ex. 5 | Ex. 6 | Com. Ex. 3 | Ex. 7 | Ex. 8 | Ex. 9 |
| Arrangement Pattern | Random | 1:1 arrangement | 1:1 arrangement | 1:5 arrangement | Random | 1:1 arrangement | 1:1 arrangement | 1:5 arrangement | Random | 1:1 arrangement | 1:1 arrangement | 1:5 arrangement |
| Particle Density (particles/mm$^2$) | 60 | 5.7 | 5.7 | 28.5 | 60 | 5.7 | 5.7 | 28.5 | 60 | 5.7 | 5.7 | 28.5 |
| Initial Conduction Ressitance | NG | G | G | G | NG | G | G | G | NG | G | G | G |
| Conduction Resistance After High-Temperature And High-Humidity Bias Test | NG | G | G | G | NG | G | G | G | NG | G | G | G |

As understood from table 1, according to the bump-forming films of Examples 1 to 9, the conductive fillers to act as bumps could be disposed on the electrode pads of the bumpless IC chip. Furthermore, the "initial conduction resistance" and the "conduction resistance after a high-temperature and high-humidity bias test" were evaluated as good. Also, a short was not caused. In particular, in the cases of the bump-forming films according to Examples 3, 6, and 9, the number of conductive fillers present on, and in the vicinity of, one electrode pad of the bumpless IC chip is five. This allows for the improvement of the alignment precision between the bump-forming film and the electrode pads of the bumpless IC chip during the manufacture of the connection structure. On the other hand, according to the bump-forming films of Comparative Examples 1 to 3, the "initial conduction resistance" and the "conduction resistance after a high-temperature and the high-humidity bias test" were both evaluated as no good. Also, a short was caused.

Example 10

Figure 8:
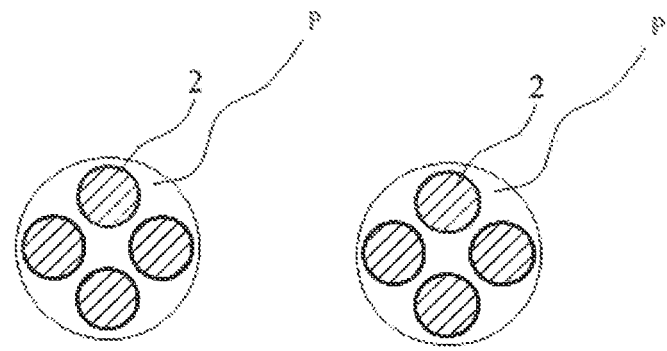
FIG. 8 is a diagram illustrating a relationship between conductive particles and electrode pads in the bump-forming film according to Example 10 in which the conductive particles are arranged at 1:4.

A bump-forming film with an overall thickness of 10 μm was obtained by repeating the same operation as that in Example 1, except that, from Example 1, the outer diameter and height of the convex portions of the transfer body master are changed to 12 μm and 10 μm, respectively, the arrangement of the conductive particles is changed to a 1:4 arrangement as illustrated in FIG. 8, the conductive fillers for bumps are changed to gold/nickel coated resin particles with an average particle diameter of 10 μm (Micropearl, Sekisui Chemical Co., Ltd.), and the thickness of the insulating adhesive resin film was set to 8 μm. It is noted that the density of the convex portions in the transfer body master was 22.9 portions/mm$^2$. Also, the closest distance between the convex portions was 4.9 μm.

Example 11

Figure 9:
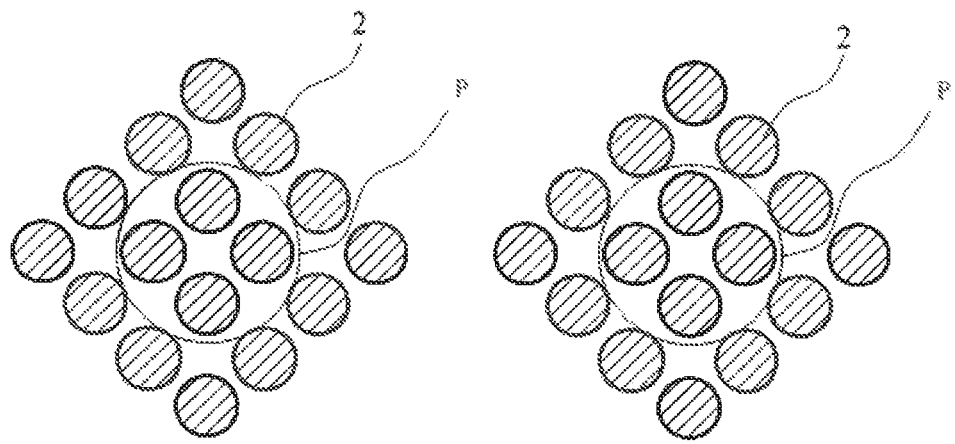
FIG. 9 is a diagram illustrating a relationship between conductive particles and electrode pads in the bump-forming film according to Example 11 in which the conductive particles are arranged at 1:16.

A bump-forming film with an overall thickness of 10 μm was obtained by repeating the same operation as that in Example 1, except that, from Example 1, the outer diameter and height of the convex portions of the transfer body master are changed to 12 μm and 10 μm, respectively, the arrangement of the conductive particles is changed to a 1:16 arrangement as illustrated in FIG. 9, and the conductive fillers for bumps are changed to gold/nickel coated resin particles with an average particle diameter of 10 μm (Micropearl, Sekisui Chemical Co., Ltd.). The existence of the conductive fillers for bumps additionally on the outer circumferential section of the bump can widen the allowable range of a gap in the film bonding process. It is noted that the density of the convex portions in the transfer body master was 91.4 portions/mm$^2$. Also, the closest distance between the convex portions was 4.9 μm.

Example 12

Figure 10:
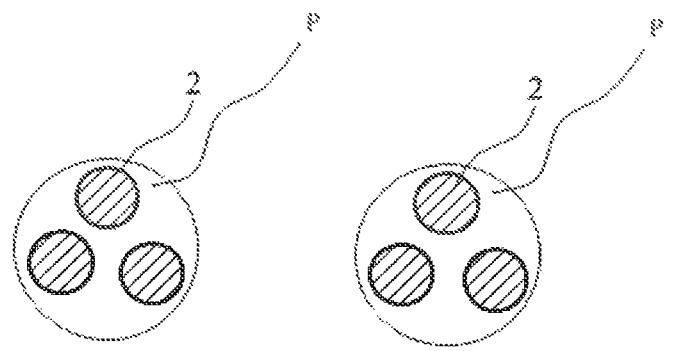
FIG. 10 is a diagram illustrating a relationship between conductive particles and electrode pads in the bump-forming film according to Example 12 in which the conductive particles are arranged at 1:3.

A bump-forming film with an overall thickness of 10 μm was obtained by repeating the same operation as that in Example 1, except that, from Example 1, the outer diameter and height of the convex portions of the transfer body master are changed to 12 μm and 10 μm, respectively, the arrangement of the conductive particles is changed to a 1:3 arrangement as illustrated in FIG. 10, and the conductive fillers for bumps are changed to gold/nickel coated resin particles with an average particle diameter of 10 μm (Micropearl, Sekisui Chemical Co., Ltd.). It is noted that the density of the convex portions in the transfer body master was 17.1 portions/mm$^2$. Also, the closest distance between the convex portions was 4.9 μm.

Example 13

Figure 11:
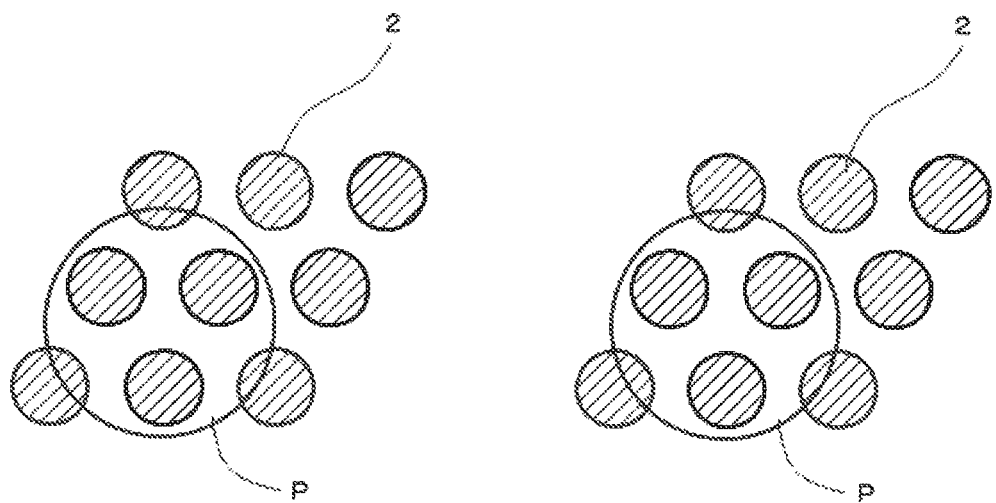
FIG. 11 is a diagram illustrating a relationship between conductive particles and electrode pads in the bump-forming film according to Example 13 in which the conductive particles are arranged at 1:9.

A bump-forming film with an overall thickness of 10 μm was obtained by repeating the same operation as that in Example 1, except that, from Example 1, the outer diameter and height of the convex portions of the transfer body master are changed to 12 μm and 10 μm, respectively, the arrangement of the conductive particles is changed to a 1:9 arrangement as illustrated in FIG. 11, and the conductive fillers for bumps are changed to gold/nickel coated resin particles with an average particle diameter of 10 μm (Micropearl, Sekisui Chemical Co., Ltd.). The existence of the conductive fillers for bumps additionally on the outer circumferential section of the bump can widen the allowable range of a gap in the film bonding process. It is noted that the density of the convex portions in the transfer body master was 51.4 portions/mm$^2$. Also, the closest distance between the convex portions was 4.9 μm.

Example 14

Figure 12:
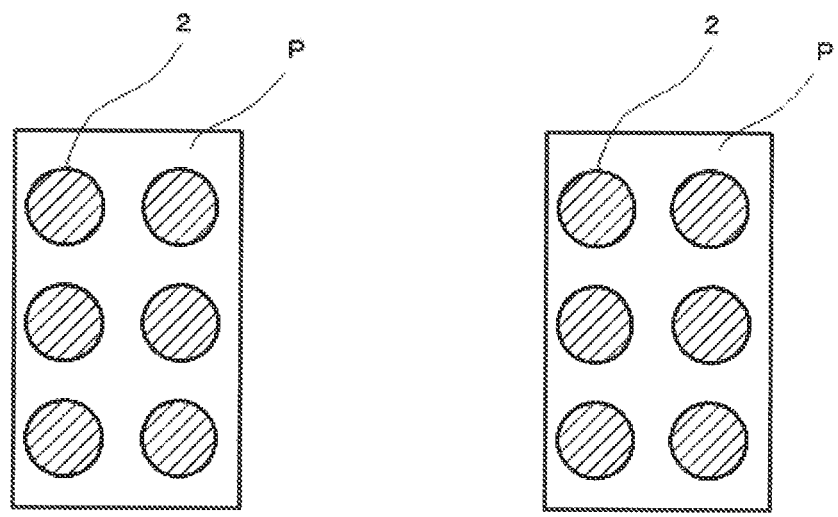
FIG. 12 is a diagram illustrating a relationship between conductive particles and electrode pads in the bump-forming film according to Example 14 in which the conductive particles are arranged at 1:6.

A bump-forming film with an overall thickness of 30 μm was obtained by repeating the same operation as that in Example 1, except that, from Example 1, the outer diameter and height of the convex portions of the transfer body master are changed to 12 μm and 10 μm, respectively, the arrangement of the conductive particles is changed to a 1:6 arrangement as illustrated in FIG. 12, and the conductive fillers for bumps are changed to gold/nickel coated resin particles with an average particle diameter of 10 μm (Micropearl, Sekisui Chemical Co., Ltd.). It is noted that the density of the convex portions in the transfer body master was 34.3 portions/mm$^2$. Also, the closest distance between the convex portions was 4.9 μm.

Example 15

Figure 13:
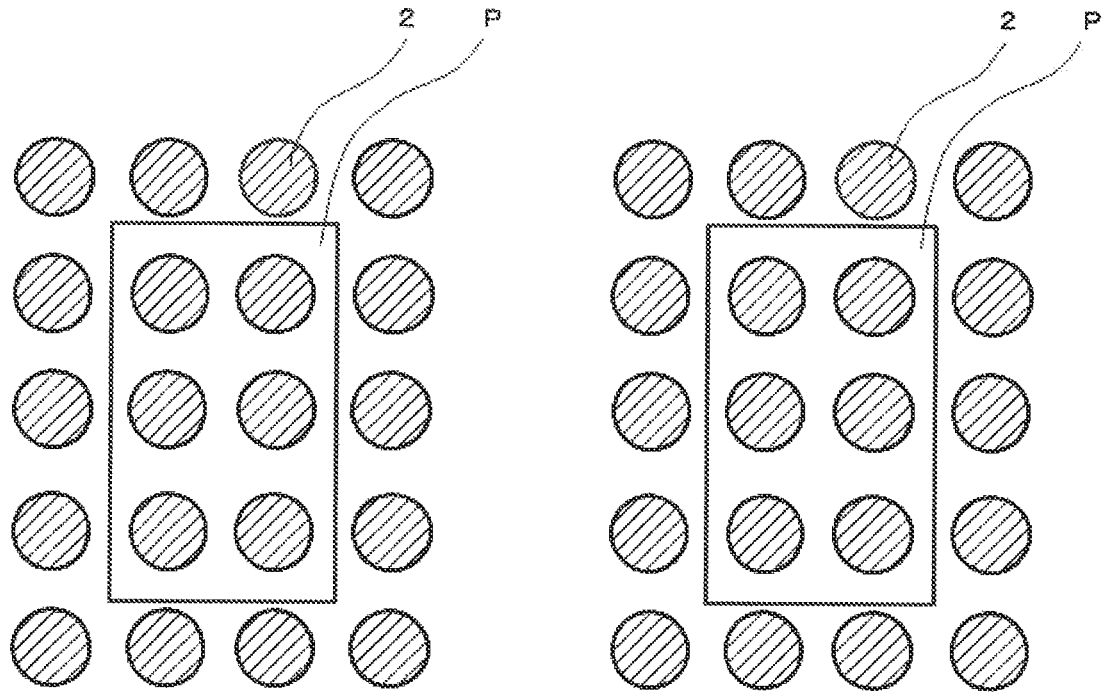
FIG. 13 is a diagram illustrating a relationship between conductive particles and electrode pads in the bump-forming film according to Example 15 in which the conductive particles are arranged at 1:20.

A bump-forming film with an overall thickness of 10 μm was obtained by repeating the same operation as that in Example 1, except that, from Example 1, the outer diameter and height of the convex portions of the transfer body master are changed to 12 μm and 10 μm, respectively, the arrangement of the conductive particles is changed to a 1:20 arrangement as illustrated in FIG. 13, and the conductive fillers for bumps are changed to gold/nickel coated resin particles with an average particle diameter of 10 μm (Micropearl, Sekisui Chemical Co., Ltd.). The existence of the conductive fillers for bumps additionally on the outer circumferential section of the bump can widen the allowable range of a gap in the film bonding process. It is noted that the density of the convex portions in the transfer body master was 114.3 portions/mm$^2$. Also, the closest distance between the convex portions was 4.9 μm.

Example 16

Figure 14:
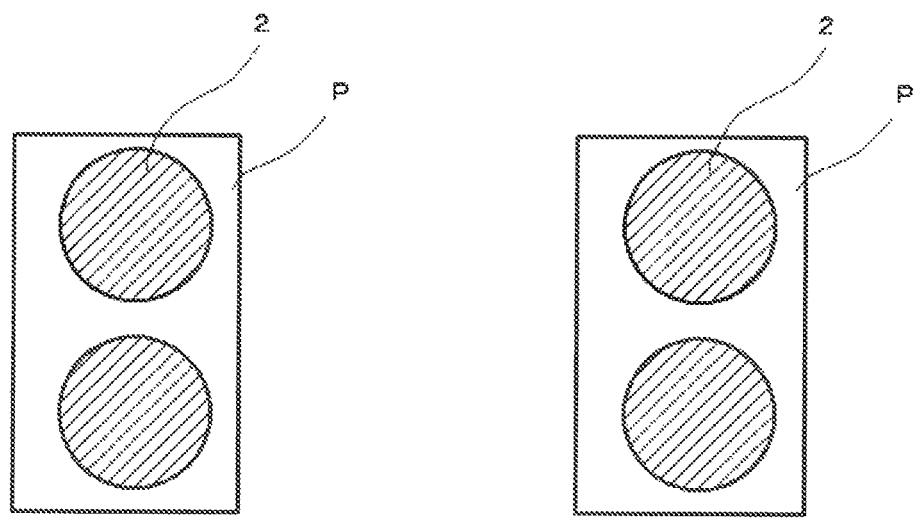
FIG. 14 is a diagram illustrating a relationship between conductive particles and electrode pads in the bump-forming film according to Example 16 in which the conductive particles are arranged at 1:2.

A bump-forming film with an overall thickness of 20 μm was obtained by repeating the same operation as that in Example 1, except that, from Example 1, the outer diameter and height of the convex portions of the transfer body master are changed to 24 μm and 20 μm, respectively, the arrangement of the conductive particles is changed to a 1:2 arrangement as illustrated in FIG. 14, the conductive fillers for bumps are changed to gold/nickel coated resin particles with an average particle diameter of 20 μm (Micropearl, Sekisui Chemical Co., Ltd.), and the thickness of the insulating adhesive resin film was set to 16 μm. It is noted that the density of the convex portions in the transfer body master was 11.4 portions/mm$^2$. Also, the closest distance between the convex portions was 9.9 μm.

Example 17

Figure 15:
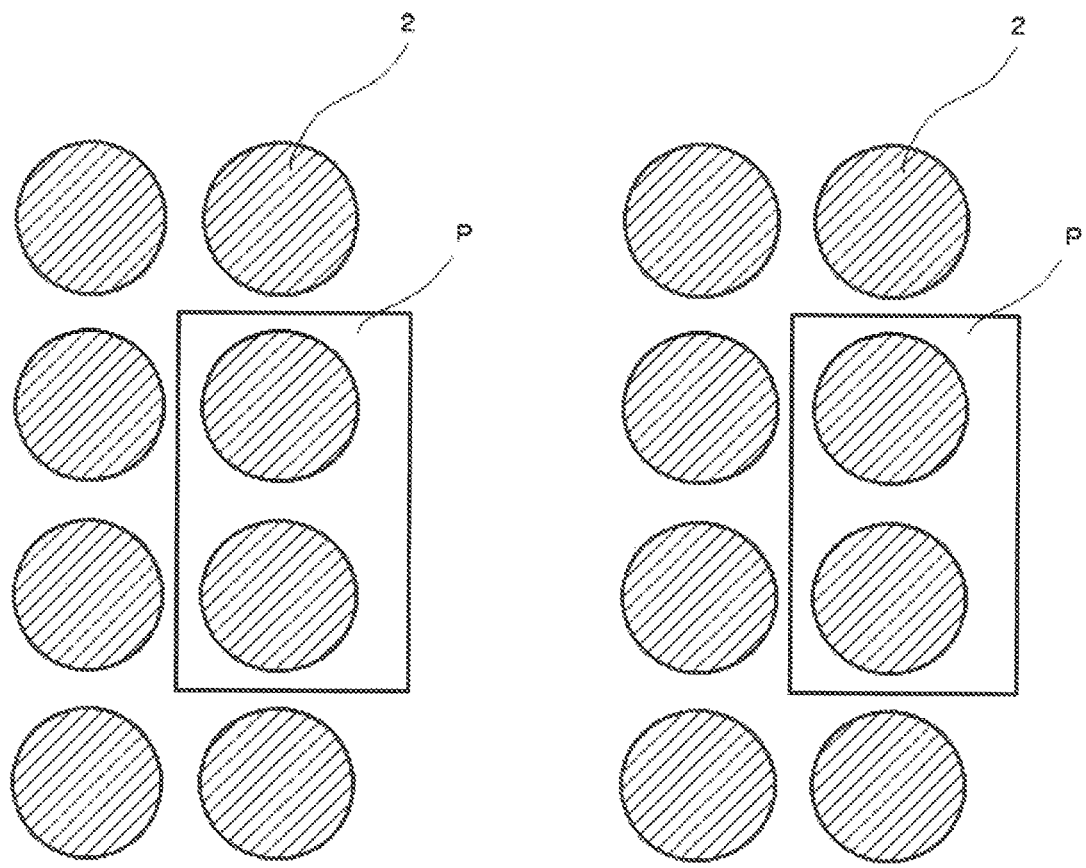
FIG. 15 is a diagram illustrating a relationship between conductive particles and electrode pads in the bump-forming film according to Example 17 in which the conductive particles are arranged at 1:8.

A bump-forming film with an overall thickness of 20 μm was obtained by repeating the same operation as that in Example 1, except that, from Example 1, the outer diameter and height of the convex portions of the transfer body master are changed to 24 μm and 20 μm, respectively, the arrangement of the conductive particles is changed to a 1:8 arrangement as illustrated in FIG. 15, and the conductive fillers for bumps are changed to gold/nickel coated resin particles with an average particle diameter of 20 μm (Micropearl, Sekisui Chemical Co., Ltd.). The existence of the conductive fillers for bumps additionally on the outer circumferential section of the bump can widen the allowable range of a gap in the film bonding process. It is noted that the density of the convex portions in the transfer body master was 45.71 portions/mm$^2$. Also, the closest distance between the convex portions was 9.9 μm.

(Production of Connection Structures with Bump-Forming Films According to Examples 10 to 17)

Connection structures were produced in the same manner as that in Example 1, except that the bump-forming films according to Examples 10 to 15 were used. Also, in the cases of the bump-forming films according to Examples 16 and 17, connection structures were produced in the same manner as that in Example 1, except that the peripherally arranged aluminum electrode pads to be evaluated are changed to have a size of 30 μm in length×85 μm in width, a pitch of 85 μm (inter-pad space: 55 μm), and 280 pins.

The connection structures produced in Examples 10 to 17 were evaluated for the initial conduction resistance in the same manner as that in Example 1. The initial conduction resistance was 5Ω or less in all the connection structures. Thus, it could be confirmed that no problem is raised for practical use. Also, a conduction reliability test was conducted after an 85° C./85% environmental test had been performed for 500 hours. As a result, the conduction resistance value after a high-temperature and high-humidity bias test was 20Ω or less in all the connection structures. Thus, it was confirmed that no problem is raised for practical use. Also, a short was not caused in all the connection structures.

Bump-forming films and connection structures were produced by repeating the same operations as those in Examples 10 to 17, except that the thickness was changed to 20 μm for each of the resin films according to Examples 10 to 15, and the thickness was changed to 25 μm and the conductive particles were pressed and embedded into one surface of the film for each of the resin films according to Examples 16 and 17. These were evaluated in the same manner as those in Examples 10 to 17, and evaluated as good similarly to the cases of Examples 10 to 17.

INDUSTRIAL APPLICABILITY

The bump-forming film according to the present invention is useful when mounting a bumpless IC chip and the like to a circuit board.

REFERENCE SIGNS LIST

1 insulating adhesive resin layer
2 conductive filler for bump
6 insulating adhesive cover layer
10, 20 bump-forming film
30 passivation film
50 concave portion of transfer body
60 base electrode
100 transfer body
200 semiconductor device
P electrode pad

The invention claimed is:
1. A bump-forming film comprising conductive fillers for bumps which are arranged regularly in a planar view in an insulating adhesive resin layer, wherein the regular arrangement has a periodic repeating unit in a longitudinal direction of the film, and a straight line which connects end points of the conductive fillers for bumps in a thickness direction of the film is substantially parallel to a surface of the film,
wherein the angle formed between the straight line which connects end points of a plurality of the conductive fillers for bumps in the thickness direction of the film and the surface of the film is within ±5°,
wherein parts of the conductive fillers for bumps are exposed from the insulating adhesive resin layer, wherein the insulating adhesive resin layer is photocurable or thermosetting, and
wherein the conductive fillers for bumps have an average particle diameter of 20 to 60 μm.

2. The bump-forming film according to claim 1, wherein a plurality of the conductive fillers for bumps constitute a unit, and a shortest distance between the conductive fillers for bumps in the unit is less than 50% of an average particle diameter of the conductive fillers for bumps.

3. The bump-forming film according to claim 1, wherein average particle diameters of the conductive fillers for bumps are substantially the same.

4. The bump-forming film according to claim 1, wherein the conductive fillers for bumps are metal-coated resin particles.

5. The bump-forming film according to claim 1 wherein the conductive fillers for bumps are solder particles.

6. The bump-forming film according to claim 1, wherein a thickness of the insulating adhesive resin layer is 0.5 to 20 times the average particle diameter.

7. A manufacturing method of the bump-forming film according to claim 1, comprising the following steps (a) to (c):
<Step (a)>
preparing a transfer body which contains regularly arranged concave portions formed on a surface thereof;
<Step (b)>
filling the concave portions of the transfer body with conductive fillers for bumps; and
<Step (c)>
superimposing and pressing an insulating adhesive resin layer on the transfer body at the surface having been filled with the conductive fillers for bumps, so that the conductive fillers for bumps are transferred to the insulating adhesive resin layer.

8. The manufacturing method according to claim 7, further comprising the following step (d)
<Step (d)>
laminating an insulating adhesive cover layer on the insulating adhesive resin layer to which the conductive fillers for bumps have been transferred, from the surface side where the conductive fillers for bumps have been transferred.

9. An electronic component having on a surface thereof a base electrode for a bump on which a bump is disposed, wherein the bump-forming film according to claim 1 is disposed on the electronic component at the surface having the base electrode such that a conductive filler for bumps of the bump-forming film becomes a bump of the base electrode.

10. A semiconductor device having on a surface thereof a base electrode for a bump on which a bump is disposed, wherein the bump-forming film according to claim 1 is disposed on the semiconductor device at the surface having the base electrode such that the conductive filler for bumps of the bump-forming film becomes a bump of the base electrode.

11. The semiconductor device according to claim 10, wherein the conductive fillers for bumps are fixed to the base electrode by curing an insulating adhesive resin layer which constitutes the bump-forming film.

12. The semiconductor device according to claim 10, wherein the conductive fillers for bumps are fixed to the base electrode by metal-bonding the fillers for forming bumps to the base electrode through heating.

13. A manufacturing method of an electronic component having on a surface thereof a base electrode for a bump on which a bump is disposed, comprising:
disposing the bump-forming film according to claim 1 on a bumpless electronic component having on the surface the base electrode for a bump at the surface having the base electrode such that the conductive filler for bumps of the bump-forming film faces the base electrode of the electronic component; and thereafter fixing the conductive filler for bumps to the base electrode with an insulating adhesive resin which constitutes the bump-forming film.

14. A manufacturing method of a semiconductor device having on a surface thereof a base electrode for a bump on which a bump is disposed, comprising:
disposing the bump-forming film according to claim 1 on a bumpless semiconductor device having on the surface the base electrode for a bump at the surface having the base electrode such that the conductive filler for bumps of the bump-forming film faces the base electrode of the semiconductor device; and thereafter fixing the conductive filler for bumps to the base electrode by curing an insulating adhesive resin layer which constitutes the bump-forming film.

15. A manufacturing method of a semiconductor device having on a surface thereof a base electrode for a bump on which a bump is disposed, comprising:
disposing the bump-forming film according to claim 1 on a bumpless semiconductor device having on the surface the base electrode for a bump at the surface having the base electrode such that the conductive filler for bumps of the bump-forming film faces the base electrode of the semiconductor device; and thereafter heating the conductive filler for bumps so as to be metal-bonded and fixed to the base electrode.

16. A connection structure wherein the conductive filler for bumps disposed on the base electrode on the surface of the electronic component according to claim 9 is connected to a corresponding terminal of another electronic component through a curable or non-curable, conductive or insulating adhesive or by forming a metal bond between them.

17. A connection structure wherein the conductive filler for bumps disposed on the base electrode on the surface of the semiconductor device according to claim 10 is connected to a corresponding terminal of another electronic component through a curable or non-curable, conductive or insulating adhesive or by forming a metal bond between them.

18. A semiconductor device having on a surface thereof a base electrode for a bump on which a bump is disposed, which is obtained by disposing the bump-forming film according to claim 1 on the semiconductor device at the surface having the base electrode such that the conductive filler for bumps of the bump-forming film becomes a bump of the base electrode, curing the insulating adhesive resin layer which constitutes the bump-forming film, and then peeling the cured insulating adhesive resin layer from the bumps.

* * * * *